United States Patent [19]
Lin

[11] Patent Number: 5,329,158
[45] Date of Patent: Jul. 12, 1994

[54] SURFACE MOUNTABLE SEMICONDUCTOR DEVICE HAVING SELF LOADED SOLDER JOINTS

[75] Inventor: Paul T. Lin, Austin, Tex.

[73] Assignee: Motorola Inc., Schaumburg, Ill.

[21] Appl. No.: 964,488

[22] Filed: Oct. 21, 1992

Related U.S. Application Data

[63] Continuation of Ser. No. 498,157, Mar. 23, 1990, abandoned.

[51] Int. Cl.$^5$ .................. H01L 23/48; H01L 29/44; H01L 29/52; H01L 29/60
[52] U.S. Cl. .............................. 257/666; 257/736; 257/772; 257/787; 257/779; 257/781
[58] Field of Search .................... 357/70, 74, 72; 257/666, 667, 734, 735, 736, 772, 787, 798, 779, 780, 781

[56] References Cited

U.S. PATENT DOCUMENTS

| | | | |
|---|---|---|---|
| 4,661,887 | 4/1987 | Lin | 361/405 |
| 4,673,967 | 6/1987 | Hingorany | 357/70 |
| 4,707,724 | 11/1987 | Suzuki et al. | 357/70 |
| 4,722,470 | 2/1988 | Johary | 228/180 |

Primary Examiner—Andrew J. James
Assistant Examiner—Carl Whitehead, Jr.
Attorney, Agent, or Firm—Jasper W. Dockrey

[57] ABSTRACT

An improved semiconductor device is disclosed having a predetermined amount of solder, or other electrically conductive binder adsorbed onto the exterior package leads of the semiconductor device. A de-wettable coating comprising preferably nickel, or alternatively chromium, is plated to a superior portion of the package leads, such that, when the heat is applied to the substrate mounting end of the leads, solder desorbes from the de-wettable layer and flows down the lead to the contact pads on the mounting substrate and forms a solder joint. The amount of solder delivered to the contact pad for joint formation is determined by the thickness of the adsorbed solder layer overlying each package lead. Only enough solder is provided on each lead sufficient to form the joint thus avoiding solder bridging between adjacent contact pads.

16 Claims, 3 Drawing Sheets

FIG.1-A
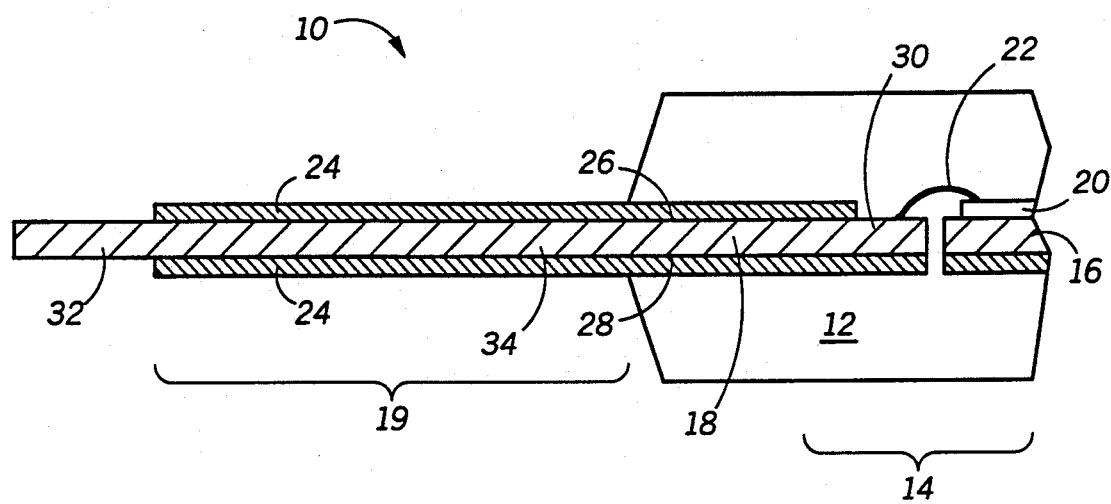
FIG.1-B
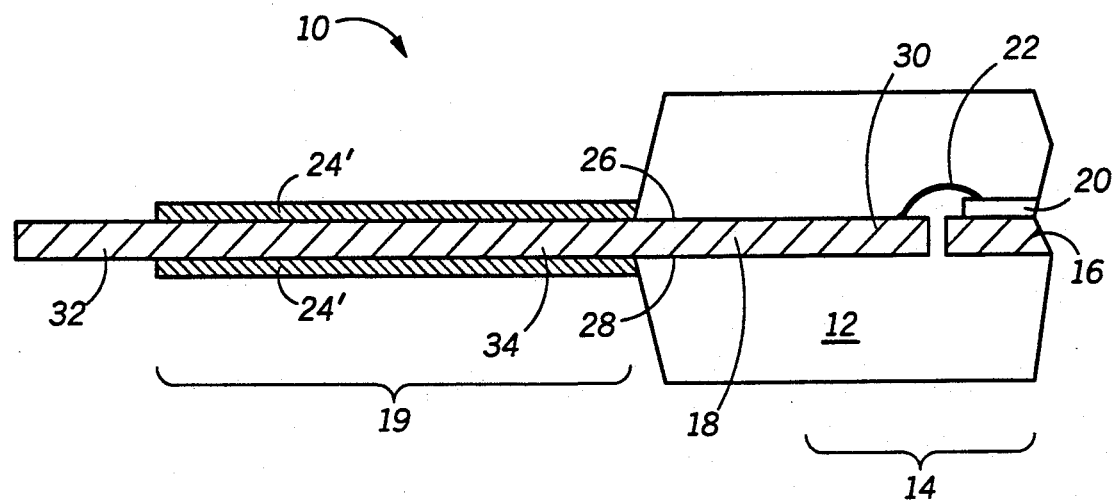

SURFACE MOUNTABLE SEMICONDUCTOR DEVICE HAVING SELF LOADED SOLDER JOINTS

This application is a continuation of prior application Ser. No. 07/498,157, filed Mar. 23, 1990 now abandoned.

Related material is disclosed in the commonly assigned, copending application Ser. No. 07/011,344.

BACKGROUND OF THE INVENTION

This invention relates to semiconductor devices and more particularly to semiconductor devices having package leads configured for surface mounting the semiconductor device to a mounting substrate.

A continuing trend in semiconductor technology is toward the fabrication of smaller and more complex semiconductor devices having an ever increasing number of circuit components. As the number of circuit components used in semiconductor devices such as integrated circuit devices increases, there is a corresponding increase in the number of wiring connections necessary to electrically connect the integrated circuit device with a user system. In meeting the requirement for more wiring connections and to reduce the overall size of the package, packaging designers have developed packages having external leads that can be mounted directly to the surface of a mounting substrate such as a printed circuit board (PCB). A package configured for surface mounting can incorporate a large number of external leads in a smaller area than, for example, a through-hole mounted package such as a dual-in-line package (DIP). A large number of package configurations have been developed for surface mounting, such as the quad flat package (QFP), the small outline package (SOP), the plastic leaded chip carrier (PLCC) and the fine pitch quad-flat-package (FQFP) being representative examples.

Surface-mount-technology (SMT) has experienced on-going development in part because of the high density device placement on a PCB obtainable using SMT. The high space efficiency on the PCB translates into increased functional power per PCB and lower system cost for the user. The exterior leads on the SMT device are often much shorter and better protected than the leads used in through-hole mountable device such as the DIP. The compact lead configuration of the SMT device can potentially result in a higher yielding board placement process than for a corresponding plated-through-hole (PTH) joining method. In addition, board placement of an surface mountable device is, in general, a simpler more reliable operation than through-hole placement, however, current surface mounting techniques involve several complex steps. First, a solder mask for the PCB must be defined and generated. Then, a solder paste must be applied to the PCB, which requires an alignment step. The actual application of the solder paste is typically done using a stencil process or a screening process, both of which require precise control and monitoring of the physical properties of the solder paste, such as viscosity, particle size distribution and adhesion characteristics. Problems, such as bridging between adjacent contact sites and clogging of the screen, can easily occur if the shear-rate is not precisely adjusted to the viscosity of the paste. Next, the SMT device must be picked up and positioned onto the PCB, which has two patterns thereon, the PCB interconnect layout and the solder mask pattern. This positioning requires a second alignment step. Finally, the solder undergoes a thermal process to make the surface joint by either a vapor phase reflow or an infrared (IR) exposure. It would be advantageous if the solder masking and screening process could be eliminated.

One innovative SMT method is described in my previous patent, U.S. Pat. No. 4,661,887 wherein a surface mountable integrated circuit having solder bearing leads is disclosed. In this method, a solder paste bearing means is provided wherein the solder paste adheres to the package lead, and in one embodiment, is channeled to the end of the lead forming a solder joint to an electrical contact pad on the substrate. Several embodiments of this invention are disclosed wherein the solder bearing means includes for example, a spiral groove filled with solder paste and extending the length of the lead, and for example, vertical slots filled with solder paste extending down a portion of the length of the lead. While this method is effective in simplifying the SMT process by eliminating the solder paste screening step, the tooling of the leads necessary to form the solder bearing means increases the cost of lead manufacturing and can in some cases reduce the mechanical rigidity of the lead. Another disadvantage with this method is that solder must completely wet the surface of the leads, which results in a requirement to use more solder on each lead than the amount actually necessary to form a solder joint between the lead and a contact land on a PCB. It would therefore be advantageous if a surface mountable semiconductor device could be fabricated that is readily mountable to a substrate mounting surface having exterior leads bearing an exact amount of solder necessary for contact joint formation and that does not require tooling of the leads.

BRIEF SUMMARY OF THE INVENTION

An object of the invention is to provide an improved surface mountable semiconductor device.

Another object of the invention is to provide an improved surface mountable semiconductor device having self loaded solder joints adsorbed to exterior leads of the semiconductor device capable of delivering a predetermined amount of solder, or other electrically conductive binder, to a substrate contact pad for the formation of a solder joint.

Yet another object of the invention is to provide an improved surface mountable semiconductor device which achieves the above objects without any physical tooling of the package leads.

Still a further object of the invention is to provide an improved process for mounting a surface mountable semiconductor device to a mounting substrate that minimizes solder bridging between adjacent contact pads on the substrate mounting surface.

These and other objects and advantages of the invention are achieved, in one embodiment, by a surface mountable semiconductor device have exterior leads each of which have a superior portion plated with a solder de-wettable layer and an un-plated substrate mounting end. A layer of solder, or other electrically conductive binding compound, is adsorbed to the leads such that upon exposure of the substrate mounting end to a thermal source, the superior solder de-wettable portion of the lead desorbes the overlying layer of solder allowing the solder to flow to the substrate mounting end of the lead and bond the lead to the substrate.

BRIEF DESCRIPTION OF THE DRAWINGS

FIG. 1-A is a partial cross sectional view of a semiconductor device, in accordance with one embodiment of the invention;

FIG. 1-B is a partial cross sectional view of a semiconductor device, in accordance with an alternate embodiment of the invention;

Figure 2:
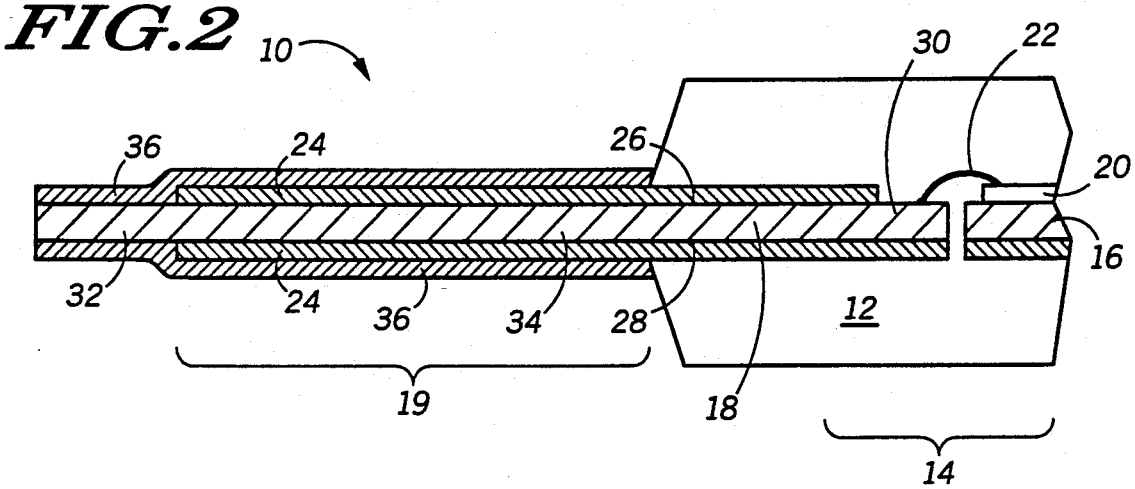
FIG. 2 is a partial, cross sectional view of the semiconductor device of FIG. 1 after solder plating of the exterior leads.

It will be appreciated that in the Figures the proportions of the various parts are not to scale. For example, the dimensions of some of the elements are exaggerated relative to each other for clarity.

DETAILED DESCRIPTION OF THE PREFERRED EMBODIMENTS

In the present invention there is provided, in one embodiment, a semiconductor device having a standard surface mountable configuration and exterior leads capable of temporarily holding a predetermined amount of solder, or other electrically conductive bonding compound, prior to the mounting of the semiconductor device on a mounting substrate. The advantages of the solder bearing exterior leads will be better understood following a description of the method for forming the exterior leads of the semiconductor device and the mounting of the semiconductor device to a mounting substrate in which a solder joint of exact size is formed joining the exterior leads to contact pads on the mounting substrate.

Throughout the specification and appended claims the term "de-wettable" is employed to describe the characteristic of a solid surface to desorb the overlying layer of adsorbed material. The term "adsorb" refers to the adhesion of an overlying layer to the surface of a solid material, wherein the adhesive force exists only within a thin layer of molecules at the interface of the two materials. The term "desorb" then refers to the breaking of the molecular adhesive forces, which is usually achieved by heating the solid material.

Shown in FIG. 1-A, in cross section, is a portion of a semiconductor device 10, according to one embodiment of the invention, having a package body 12 enclosing a portion of a leadframe 14. Package body 12 is formed from a molded plastic compound, such as a modified epoxy resin filled with glass or aluminum oxide, or an epoxy silicone, or the like. Leadframe 14 has a die flag 16 and a plurality of outer package leads, one of which, outer lead 18, is shown in the cross sectional view of FIG. 1-A. An electronic component 20 is bonded to die flag 16 by an adhesive such as a silver-filled epoxy or a polyimide compound, or the like, and electrically connected to outer lead 18 by an inner lead 22. Inner lead 22 is one of many such leads used to connect electronic component 20 to the outer package leads of semiconductor device 10. Electronic component 20 can be one of several types of electronic devices such as an integrated circuit device, a discrete device or a hybrid device, or the like. In addition, inner lead 22 can be a wire bond or a tape-automated-bond (TAB) bond. In another embodiment of the invention, electronic component 20 is mounted in a flip-chip configuration and bonded directly to the outer package leads. Although inner lead 22 is depicted in FIG. 1-A, and all the Figures in the drawing, as a wire bonded connection structure, it is intended that TAB and flip-chip methods of connection of electronic component 20 to outer lead 18 be included within the scope of the invention.

Leadframe 14 is preferably constructed from an intermetallic compound comprised of a copper-phosphor metal alloyed with tin (Sn) and another component selected from the group consisting of nickel(Ni), iron(Fe), zinc(Zn) and magnesium(Mg), and combinations thereof. A substantial portion of outer lead 18 is plated with a de-wettable coating 24. The function of de-wettable coating 24 is to temporarily bear an overlying layer of solder, or other electrically conductive binding compound, which is adsorbed onto the surface of outer lead 18. Once outer lead 18 is in positioned at a the proper location on a mounting substrate, de-wettable coating 24 is heated and the overlying solder layer desorbes, or de-wets from the surface of de-wettable coating 24. As shown in FIG. 1-A, de-wettable coating 24 overlies the side of die flag 16 opposite to electronic component 20 and major portions of the upper and lower surfaces of the outer package leads. In particular, de-wettable coating 24 overlies a central portion of an upper surface 26 of outer lead 18 and a substantial portion of a lower surface 28 of outer lead 18. Outer lead 18 has an exposed proximal portion 30 on upper surface 26, which provides a site for attachment of inner lead 22, and an uncoated substrate mounting end 32. De-wettable coating 24 preferably comprises a de-wettable metal layer such as nickel (Ni), or chromium (Cr), or the like. Alternatively, de-wettable coating 24 can comprise a metallic oxide layer, such as copper oxide (CuO) or aluminum oxide ($Al_2O_3$), or the like. Furthermore, de-wettable coating 24 can be an intermetallic alloy having a solder de-wettable surface such as SnCu or SnNi, or the like.

In accordance with the invention, de-wettable coating 24 provides a de-wettable surface capable of desorbing an electrically conductive binder such as a lead (Pb)-tin(Sn) solder or a conductive epoxy, or the like. In addition, de-wettable coating 24 improves the adhesion of the epoxy resin of package body 12 to the metal surface of leadframe 14. Good adhesion of the epoxy resin to the metal surface of leadframe 14 improves the functional reliability and the durability of semiconductor device 10. In one embodiment, de-wettable coating 24 is applied to leadframe 14 by first forming a photoresist pattern on leadframe 14 having a predetermined outline. Next, leadframe 14 is placed in a plating bath and successive layers of preferably Ni, or alternatively Cr, are deposited on the exposed areas of leadframe 14 to form de-wettable coating 24. After removing leadframe 14 from the plating bath, the photoresist pattern is removed and leadframe 14 is heat treated to bond de-wettable coating 24 to leadframe 14. Following the formation of coating 24 on leadframe 14, electronic component 20 is attached to die flag 16 and connections, such as inner lead 22, are made between bonding pads (not shown) located on the face of electronic component 20 and the outer leads of leadframe 14, such as outer lead 18. Leadframe 14 and electronic component 20 are then encapsulated within package body 12 by a transfer molding process. The improved adhesion characteristics provided by de-wettable coating 24 aid in the transfer molding process by enhancing chemical bonding between the mold compound comprising package body 12 and the metal surface of leadframe 14. Package body 12 is formed around leadframe 14 such that an exterior lead segment 19 protrudes through and extends beyond package body 12. Exterior lead segment 19 comprises a superior portion 34 adjacent to package body 12 and substrate mounting end 32.

An alternative embodiment of the invention is shown in FIG. 1-B wherein a de-wettable coating 24' has been generated on exterior lead segment 19 by the oxidation of outer lead 18. In the alternative embodiment, leadframe 14 is constructed from an oxidizable metal such as copper. Following the formation of package body 12, a post molding process is performed by heating semiconductor device 10 for a predetermined period of time at a temperature of about 120 to about 150 degrees centigrade. The post molding process forms a layer of copper oxide (CuO) on exterior lead segment 19. After the layer of CuO is formed, exterior lead portion 19 is covered with a protective layer of photoresist using a conventional screen printing process, or alternatively, in the case of high density exterior leads, a photolithography process. Then, the exposed portion of de-wettable coating 24', overlying substrate mounting end 32, is etched using an acidic copper oxide etch solution. Following the copper oxide etch, the photoresist is removed yielding the structure shown in FIG. 1-B. It will be apparent to those skilled in the art that other de-wettable materials and application processes can be used to form de-wettable coating 24' on exterior lead segment 19 after package body 12 has been molded to leadframe 14. For example, a metal layer such as Ni or Cr, or an intermetallic metal alloy, such as SnNi or SnCu, or the like, can be plated to exterior lead segment 19 after package body 12 has been molded to leadframe 14 by immersing semiconductor device 10 in a plating bath. The inventive process then continues with a second plating process using either the structure shown in FIG. 1-A or FIG. 1-B.

After package body 12 has been molded to leadframe 14, the assembly is placed in a second plating bath where a layer of solder, or other electrically conductive bonding compound such as a silver-filled epoxy, is plated to exterior lead segment 19, as shown in FIG. 2. The process parameters of the plating bath are adjusted such that a solder layer 36 will be deposited to a predetermined thickness on the outer package leads. The plated thickness of solder layer 36 necessary to perform the function of forming an exactly sized solder joint will vary depending upon geometrical factors such as lead thickness, lead pitch and package design. The solder plating bath comprises a fluoroboric acid solution containing both stannous and lead fluoroborate, and small amounts of peptone and is operated at a temperature of about 15-40 degrees centigrade. A solder having about 60% Pb and 40% Sn will be plated onto all exposed metallic surfaces. The relative concentrations of stannous and lead fluoroborate can be adjusted to vary the composition of the plated solder layer. In the bath, solder will only be deposited on exposed metal surfaces of semiconductor device 10 where a seed layer can form, such as exterior lead segment 19, and not on the plastic surface of package body 12. As shown in FIG. 2, the solder plating process has formed solder layer 36, having preferably about 60% Sn and 40% Pb, on superior portion 34 of exterior lead segment 19 and substrate mounting end 32. Solder de-wettable coating 24 supports solder layer 36 overlying superior lead portion 34 wherein solder layer 36 is adsorbed onto de-wettable coating 24. Adsorbed solder layer 36 will adhere to the surface of de-wettable coating 24 for a prolonged period of time so long as the interface between the two layers does not become exposed to heat. Thermal energy will excite the molecules in each layer and result in the desorption of solder layer 36.

Figure 3:
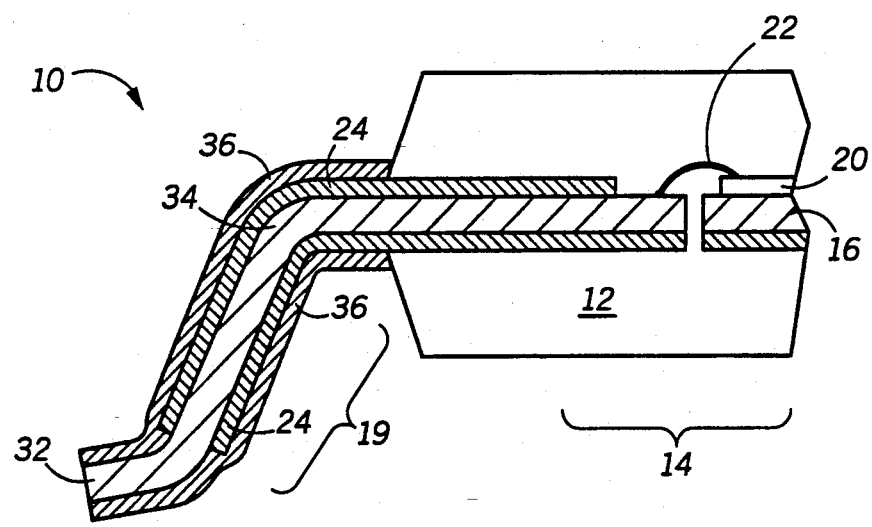
FIG. 3 is a partial, cross sectional view of the semiconductor device of FIG. 1 after lead forming.

Once solder layer 36 has been formed, the outer leads are forged into a predetermined shape for surface mounting semiconductor device 10 to a mounting substrate. In accordance with the invention, exterior lead segment 19 can be forged into different shapes for surface mounting semiconductor device 10, such as J-leads, butt-joints, or gull-wing lead shape which is the lead shape depicted in FIG. 3. As illustrated in FIG. 3, exterior lead segment 19 has been formed to have superior portion 34 above flattened distal portion 32. The forging of exterior lead segment 19 into a gull-wing configuration places a substantial solder bearing portion of exterior lead segment 19 in a position above substrate mounting end 32. When heat is applied during a solder reflow operation to exterior lead segment 19, solder layer 36 will de-wet from de-wettable layer 24 and the force of gravity will cause the solder, overlying superior lead portion 34, to flow to substrate mounting end 32. One skilled on the art will recognize that the same functional relationship can be attained with different surface mount lead configurations such as a J-leads or butt-joints, or the like.

Figure 4:
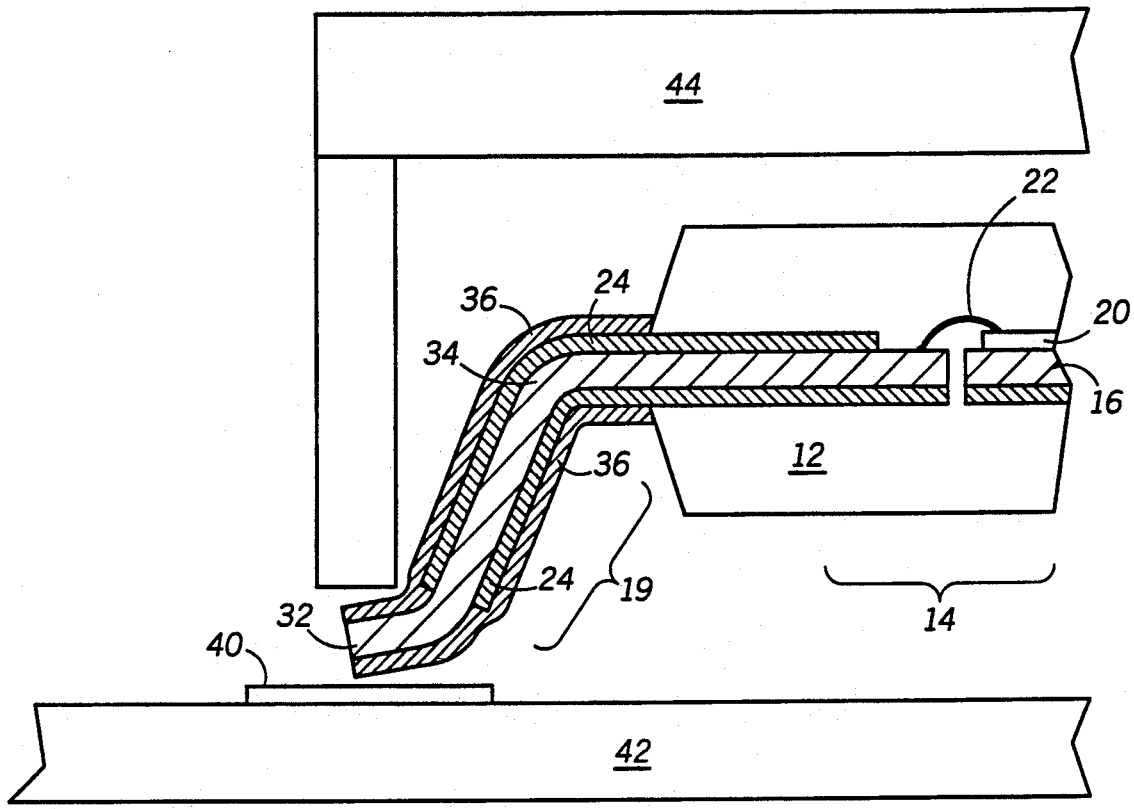
FIG. 4 is a partial, cross sectional view of the semiconductor device of FIG. 1 showing the formation of a solder joint during surface mounting to a mounting substrate.

After semiconductor device 10 is properly positioned on a mounting substrate, the reflow of solder is initiated by transferring heat to the outer leads by means conduction or radiative heat transfer. Conductive heat transfer is performed using a thermode or other thermally conductive device. Alternatively, the outer leads can be radiative heated by the application of a laser beam or other radiative heating device. In a one embodiment, illustrated in FIG. 4, substrate mounting end 32 is position onto a contact land 40 located on the surface of a mounting substrate 42 and a hot-bar mounting-tool 44 makes thermal contact with solder layer 36 overlying substrate mounting end 32. The heating of exterior lead segment 19 excites the molecules at the interface of solder layer 36 and de-wettable coating 24 causing all of solder layer 36 overlying coating 24 to desorb from de-wettable coating 24 and flow down exterior lead segment 19 from superior lead portion 34 to substrate mounting end 32. In this manner, a controlled amount of solder is singularly delivered to contact land 40 for solder joint formation.

It should be noted that high performance semiconductor devices such as semiconductor device 10 have many, very thin, tightly spaced exterior leads, such as exterior lead segment 19. In a board placement operation, the devices are mechanically positioned and aligned to the mounting site. It is essential that this procedure be accomplished without deforming the exterior leads of the device. The extra rigidity provided to exterior lead segment 19, and all such exterior leads of semiconductor device 10 by solder layer 36 improves the reliability of device placement on a PCB or other mounting substrate.

Figure 5:
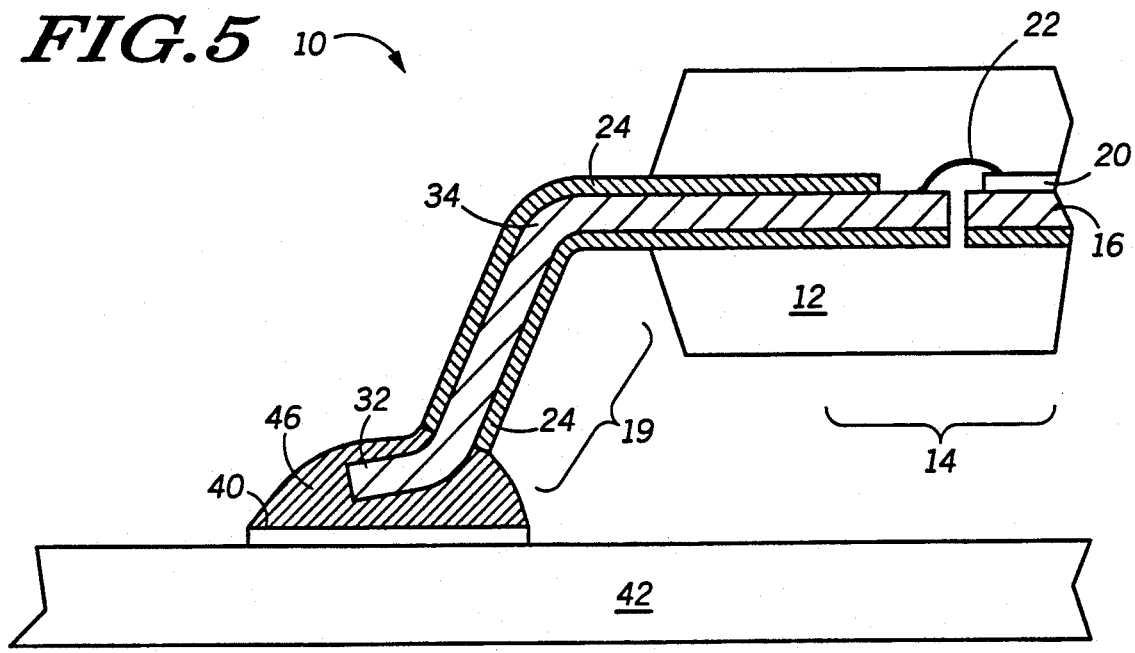
FIG. 5 is a partial, cross sectional view of the semiconductor device of FIG. 1 showing the finished solder joint and the appearance of the an exterior lead after solder joint formation.

As shown in FIG. 5, the application of heat to solder layer 36, substrate mounting end 32 and contact land 40, and the subsequent reflow of solder down exterior lead segment 19, results in the formation of a solder joint 46. Solder joint 46 makes both a mechanical and electrical connection between exterior lead segment 19 and contact land 40. A particular advantage of the invention is the ability to provide a precise, predetermined quantity of solder, or other electrical bonding compound, to form solder joint 46. The methods of the prior art, including screen printing, wave soldering and the like, initially present excess solder to the mounting substrate for joint formation. If excessive amounts of solder are not removed prior to joint formation, a solder connection can be formed between adjacent contact lands on the surface of the mounting substrate. The unwanted solder connection, known in the art as a "bridge" or "bridging", causes an electrical short between two or more contact lands resulting in an in-operable board assembly.

In the case where solder paste is applied to the leads prior to mounting the semiconductor device on a PCB, the previous methods of forming solder bearing leads also used excess solder, because more solder than that amount necessary to form a solder joint was needed to satisfy the requirement to completely wet the leads, in addition to forming the solder joint. The need to spread solder over the entire surface of the lead arises because of surface tension forces which, in the case of certain metals such as copper and alloys such as alloy 42, do not cause the solder to ball on the metal surface, but rather the opposite, the forces are very weak and allow the solder to spread evenly over the metal surface. The requirement to wet the leads complicates the solder paste application process and can result in the application of excess solder paste on the leads. The presence of excess solder on the leads can caused shorting between adjacent exterior leads above the PCB. The present invention avoids the necessity of using excess solder by plating solder layer 36 to a sufficient thickness over solder de-wettable layer 24, such that only the amount of solder necessary for the formation of solder joint 46 is present during surface mounting of semiconductor device 10 to mounting substrate 42.

Thus it is apparent that there has been provided, in accordance with the invention, a semiconductor device which fully meets the objects and advantages set forth above. Although particular embodiments of the invention have been described in the foregoing description, it will be apparent to one skilled in the art that numerous modifications and variations can be made to the presented embodiments which still fall within the spirit and scope of the invention. For example, the invention can be applied to semiconductor devices lacking outwardly projecting exterior leads such as a plastic-leaded-chip-carrier (PLCC). The application of the invention to an PLCC device dispenses with the need for solder columns and preforms on the input/output pads of the PLCC. Furthermore, the invention can be used in semiconductor devices having a short-pin, surface-mounted, pin-grid-array (PGA) type package. Accordingly, it is intended that all such variations and modifications as fall within the scope of the appended claims and equivalents thereof be included within the invention.

I claim:

1. A surface mountable semiconductor device comprising:

a package body having a series of outer leads comprising a core of binder wettable material and an overlying layer of binder de-wettable material, each of the leads having a substrate mounting end and a superior portion adjacent to the package body, wherein the superior portion is plated with the binder de-wettable material and a bonding portion of the core is exposed by the binder de-wettable material at the substrate mounting end; and an electrically conductive binder directly overlying and in intimate contact with the binder de-wettable coating at the superior portion of the lead and in contact with the bonding portion of the core at the substrate mounting end.

2. The surface mountable semiconductor device of claim 1 wherein the binder de-wettable coating comprises a metal selected from the group consisting of nickel and chromium.

3. The surface mountable semiconductor device of claim 1 further comprising a integrated circuit device electrically coupled to the outer leads by a series of inner leads.

4. The surface mountable semiconductor device of claim 1 wherein the electrically conductive binder comprises a material selected from the group consisting of lead-tin solder and silver-filled epoxy.

5. A surface mountable semiconductor device comprising:

a package body having a series of outer leads comprising a core of solder wettable material and an overlying layer of solder de-wettable material, each of the leads having a substrate mounting end where the core is exposed by the solder de-wettable material and a superior portion adjacent to the package body; and a solder paste directly overlying and in intimate contact with the solder de-wettable coating and connected to the exposed core at the substrate mounting end, such that the solder paste on the leads can flow from the superior portion to the substrate mounting end during a solder flow operation and bond the exposed core at the substrate mounting end to a substrate.

6. The surface mountable semiconductor device of claim 5 wherein the solder de-wettable coating comprises a metal selected from the group consisting of nickel and chromium.

7. The surface mountable semiconductor device of claim 5 wherein the binder de-wettable coating comprises an intermetallic alloy selected from the group consisting of tin-nickel and tin-copper.

8. The surface mountable semiconductor device of claim 5 wherein the solder de-wettable coating comprises copper oxide.

9. The surface mountable semiconductor device of claim 5 wherein the solder paste comprises a solder having about 60% lead and 40% tin.

10. The surface mountable semiconductor device of claim 5 wherein the leads have a configuration selected from the group consisting of J-lead, gull-wing and butt joint.

11. A surface mountable semiconductor device comprising:

an electronic device enclosed within a package body;

a plurality of package leads extending from a position proximate the electronic device comprising a core of solder wettable material and an overlying layer of solder de-wettable material, each of the package leads having a substrate mounting end configured for surface mounting the semiconductor device to a substrate wherein the core is exposed by the solder de-wettable material at the substrate mounting end;

a solder paste directly overlying and in intimate contact with the solder de-wettable material and in contact with the exposed portion of the core at the substrate mounting end; and a plurality of inner leads coupling the electronic device to the package leads, wherein each inner lead is bonded to the core material of at least one package lead in a region exposed by the solder de-wettable material.

12. The surface mountable semiconductor device of claim 11 wherein the solder de-wettable coating comprises a metal selected from the group consisting of nickel and chromium.

13. The surface mountable semiconductor device of claim 11 wherein the binder de-wettable coating comprises an intermetallic alloy selected from the group consisting of tin-nickel and tin-copper.

14. The surface mountable semiconductor device of claim 11 wherein the solder de-wettable coating comprises copper oxide.

15. The surface mountable semiconductor device of claim 11 wherein the solder paste comprises a solder having about 60% lead and 40% tin.

16. The surface mountable semiconductor device of claim 11 wherein the leads have a configuration selected from the group consisting of J-lead, gull-wing and butt joint.

* * * * *